(12) United States Patent
Guo et al.

(10) Patent No.: US 9,620,207 B2
(45) Date of Patent: Apr. 11, 2017

(54) REFERENCE VOLTAGE GENERATORS AND SENSING CIRCUITS

(71) Applicant: Micron Technology, Inc., Boise, ID (US)

(72) Inventors: Xinwei Guo, Folsom, CA (US); Mingdong Cui, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/004,781

(22) Filed: Jan. 22, 2016

(65) Prior Publication Data

US 2016/0141028 A1 May 19, 2016

Related U.S. Application Data

(62) Division of application No. 14/287,946, filed on May 27, 2014, now Pat. No. 9,245,597, which is a division of application No. 13/194,831, filed on Jul. 29, 2011, now Pat. No. 8,737,120.

(51) Int. Cl.

| | |
|---|---|
| *G11C 13/00* | (2006.01) |
| *G11C 7/06* | (2006.01) |
| *G11C 7/14* | (2006.01) |
| *G05F 3/16* | (2006.01) |
| *G11C 5/14* | (2006.01) |
| *G11C 8/08* | (2006.01) |
| *G05F 1/46* | (2006.01) |

(52) U.S. Cl.
CPC ............ *G11C 13/004* (2013.01); *G05F 1/461* (2013.01); *G05F 3/16* (2013.01); *G11C 5/147* (2013.01); *G11C 7/062* (2013.01); *G11C 7/14* (2013.01); *G11C 8/08* (2013.01); *G11C 13/0004* (2013.01); *G11C 13/0038* (2013.01); *G11C 2013/0054* (2013.01)

(58) Field of Classification Search
CPC . G11C 13/0004; G11C 13/0038; G11C 5/147; G11C 7/06; G11C 7/08; G11C 16/30; G06F 2212/202; G06F 2212/2022; G06F 2212/222; Y10T 307/944
See application file for complete search history.

(56) References Cited

U.S. PATENT DOCUMENTS

| | | | | |
|---|---|---|---|---|
| 6,075,725 A | * | 6/2000 | Choi | ........... G11C 11/56 365/185.03 |
| 6,140,805 A | * | 10/2000 | Kaneko | ........... G11O 5/145 323/265 |
| 6,177,785 B1 | | 1/2001 | Lee | |
| 7,327,186 B1 | | 2/2008 | Wadhwa et al. | |

(Continued)

FOREIGN PATENT DOCUMENTS

DE 4240736 6/1994

*Primary Examiner* — Son Dinh
*Assistant Examiner* — Uyen B Tran
(74) *Attorney, Agent, or Firm* — Dorsey & Whitney LLP (57) ABSTRACT

Described examples include sensing circuits and reference voltage generators for providing a reference voltage to a sensing circuit. The sensing circuits may sense a state of a memory cell, which may be a PCM memory cell. The sensing circuits may include a cascode transistor. Examples of reference voltage generators may include a global reference voltage generator coupled to multiple bank reference voltage generators which may reduce an output resistance of the voltage generator routing.

20 Claims, 4 Drawing Sheets

(56) References Cited

U.S. PATENT DOCUMENTS

| | | |
|---|---|---|
| 7,477,559 B2 | 1/2009 | Taddeo |
| 7,570,040 B2 | 8/2009 | Migliavacca |
| 7,656,225 B2 | 2/2010 | Isobe et al. |
| 7,898,295 B1 | 3/2011 | Kasturirangan et al. |
| 2003/0071748 A1* | 4/2003 | Huang ............... H03M 1/0845 341/155 |
| 2004/0120200 A1 | 6/2004 | Gogl et al. |
| 2007/0217266 A1 | 9/2007 | Kim |
| 2008/0062777 A1* | 3/2008 | Kang .................... G11C 5/14 365/189.09 |
| 2008/0246537 A1 | 10/2008 | Aziz |
| 2009/0021987 A1* | 1/2009 | Sarin .................. G11C 11/5642 365/185.21 |
| 2009/0175094 A1 | 7/2009 | Scheuerlein |
| 2009/0302815 A1* | 12/2009 | Tanzawa ............... G05F 1/577 323/282 |
| 2010/0080041 A1 | 4/2010 | Tonomura |
| 2010/0164601 A1 | 7/2010 | Jansen |
| 2010/0165720 A1 | 7/2010 | Lin et al. |
| 2010/0165724 A1 | 7/2010 | Pellizzer et al. |
| 2011/0032746 A1 | 2/2011 | Maejima et al. |
| 2012/0286881 A1* | 11/2012 | Mahooti ............... H03K 5/249 331/47 |
| 2013/0028014 A1 | 1/2013 | Guo et al. |

* cited by examiner

REFERENCE VOLTAGE GENERATORS AND SENSING CIRCUITS

CROSS REFERENCE TO RELATED APPLICATIONS

This application is a divisional of U.S. application Ser. No. 14/287,946 filed May 27, 2014, which is divisional of U.S. application Ser. No. 13/194,831, filed Jul. 29, 2011, and issued as U.S. Pat. No. 8,737,120 on May 27, 2014. These applications and patent are incorporated herein by reference in their entirety and for all/any purpose.

TECHNICAL FIELD

Embodiments of the invention relate generally to memory, and include examples of reference voltage generators and circuits and methods for memory sensing.

BACKGROUND

Memory devices may be provided as integrated circuits in computers or other electronic devices. There are many different types of memory devices, and memory devices may generally be volatile or non-volatile. Volatile memory may require power to maintain information stored therein, while non-volatile memory may not lose the stored information in the absence of power. Examples of volatile memory include DRAM and SDRAM memory devices. Examples of non-volatile memory include ROM, flash memory, and resistance variable memory. With increasing popularity of electronic devices, such as laptop computers, portable digital assistants, digital cameras, mobile phones, digital audio players, video game consoles and the like, demand for nonvolatile memories are considered to be on the rise.

Examples of resistance variable memory, a type of non-volatile memory, include phase change memory (PCM) devices. A phase change memory cell layout may resemble that of a DRAM memory cell, with the DRAM capacitor being replaced by a phase change material, such as Germanium-Antimony-Telluride (GST). The phase change material, e.g. GST, may exist in two states—an amorphous, high resistance state, or a crystalline, low resistance state. The resistance state of the material may be altered by applying current pulses to the cell, for example by heating the material with a programming current. In this manner, a PCM memory cell may be programmed to a particular resistance state through use of a programming current. In some examples, the amorphous, high resistance state of the material in the memory cell may correspond to a logic state of 1, while the crystalline, low resistance state of the material in the memory cell may correspond to a logic state of 0. In other examples, the opposite logic assignments may be used.

The programmed resistance state of a PCM cell may be determined by sensing a current and/or voltage associated with the cell. During a sensing operation, e.g. a read operation, a sensed voltage and/or current associated with the PCM cell may be compared with one or more reference voltages and/or currents to determine the particular state of the PCI cell.

DETAILED DESCRIPTION

Described examples include sensing circuits and reference voltage generators for providing a reference voltage to a sensing circuit. The sensing circuits may sense a state of a memory cell, which may be a PCM memory cell. Certain details are set forth below to provide a sufficient understanding of embodiments of the invention. However, it will be clear to one skilled in the art that embodiments of the invention may be practiced without various of these particular details. In some instances, well-known circuits, control signals, timing protocols, materials, and software operations have not been shown in detail in order to avoid unnecessarily obscuring the described embodiments of the invention.

Embodiments of the present invention accordingly may provide low power, fast, and accurate sensing of memory cells. Accurate, fast sensing may be advantageous in PCM memory devices where sensing may be a limiting factor in a read path, limiting delay between successive reads. The available read window may be determined by the PCM technology used, that is the set and reset capability of the cell itself and the bias voltage allowed without disturbing the memory cell.

Figure 1:
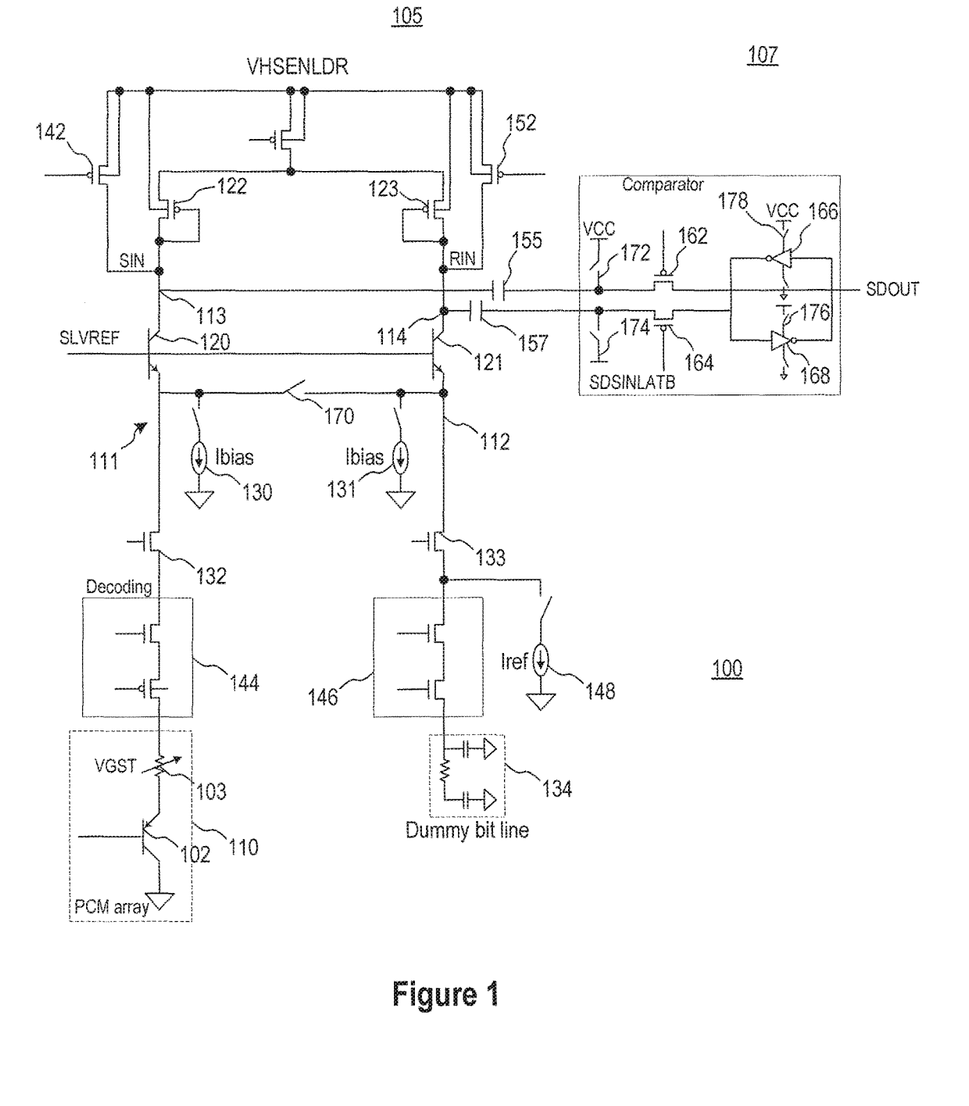
FIG. 1 is a schematic illustration of a sensing circuit in accordance with an embodiment of the present invention.

FIG. 1 is a schematic illustration of a sensing circuit in accordance with an embodiment of the present invention. The sensing circuit 100 includes a pre-sense circuit 105 and a comparator 107. The pre-sense circuit 105 may be in a high voltage power domain, while the comparator 107 is in a normal $V_{cc}$ reference voltage domain. The pre-sense circuit 105 may bias one or more PCM cells 110. The PCM cell 110 is represented by a transistor 102 and variable resistor 103. Generally, a current based on the state of the one or more memory cells 110 is provided in a leg 111 of the pre-sense circuit 105, while a reference current is provided in a leg 112 of the pre-sense circuit 105. A voltage is provided at the nodes 113 and 114 that may be based on the current in the respective legs. A voltage difference based on the difference between the current in the legs 111 and 112 is accordingly provided at an output of the pre-sense circuit 105, e.g. the nodes 113 and 114 in FIG. 1. The nodes 113 and 114 are coupled to inputs of the comparator 107. The comparator 107 may amplify the voltage difference to provide (e.g., generate) an output signal SDOUT.

The pre-sense circuit 105 uses a cascode configuration. The transistors 120 and 121 are each connected in a cascode configuration to provide the voltage difference at the nodes 113 and 114. The cascode configuration generally includes an amplifier stage followed by a current buffer stage. In FIG. 1, a collector of the cascode transistor 120 is coupled to a drain of a load transistor 122 to form the cascode configuration. The emitter of the cascode transistor 120 is coupled to the memory cell 110 to be sensed. Similarly, a collector of the cascode transistor 121 is coupled to a drain of a load transistor 123 to form the cascode configuration. The cascode transistors 120 and 121 receive a reference voltage, SLVREF at their bases. The cascode transistors 120 and 121 may be implemented as bipolar junction transistors, as shown. The use of bipolar junction transistors may be advantageous due to the improved matching characteristics available, such that the transistors 120 and 121 may have improved matching, which may improve the sensing performance of the sensing circuit 100. For example, because the transistors 120 and 121 are better matched, accurate sensing may be obtained faster in some examples. Moreover, bipolar junction transistors may generally have a higher transconductance, Gm, than FETs, which may also improve the sensing performance of the sensing circuit 100 in some examples, in particular, the higher Gm may allow for faster settling of a bias to the PCM memory cells 110.

Accordingly, bipolar junction transistors may be used in the cascode configurations described. N-channel BJTs 120 and 121 are shown in FIG. 1. In other examples, FETs may be used. The load transistors 122 and 123 may be implemented as FET devices. As shown in FIG. 1, p-FETs are used to implement the load transistors 122 and 123. In other examples, different configurations of n-channel and p-channel BJTs and FETs may be used to implement a cascode configuration for use as the pre-sense amplifier 105.

The resistance of a PCM cell may change on the order of 100× between a set and a reset cell. This variation may disrupt the bias conditions of the pre-sense circuit 105, such as the bias conditions of the cascode transistors 120 and 121. Accordingly, the pre-sense circuit 105 includes bias current sources 130 and 131. The bias current sources 130 and 131 may be connected to the emitters of the cascode transistors 120 and 121, respectively. The bias current sources 130 and 131 provide a bias current through the legs 111 and 112 such that the large range of resistance of the PCM cell 110 may be accommodated. This may enlarge the available read window in some examples. To illustrate this, in one example, the PCM cell resistance may change from a resistance in the kilo-ohm range to a resistance in the mega-ohm range. The resulting current in the leg 111 may change from nano-amps to micro-amps, 100 nA to 10 μA in one example. If a bias current of 5 μA is provided by the bias current sources 130 and 131, the difference in voltage at the emitter of the cascode transistor 120 may be reduced. It may be 5 μA+100 nA in one state and 15 μA in the other state, for example, only about a 3× variation.

Isolation transistor 132 may be provided between the memory cell 110 and the cascode transistor 120. A similar isolation transistor 133 may be provided between a dummy bit line 134 and the cascode transistor 121. The isolation transistors 132 and 133 may block the application of high voltage to the pre-sense circuit during a write operation. The isolation transistors 132, 133 may generally be thick oxide devices, while thin oxide devices are used for the sense operation itself. Decoding transistors 144 are also shown in the leg 111, which may be used to decode the memory cell 110.

Transistor 142 has a drain coupled to the drain of the load transistor 122, and a source coupled to a reference voltage. The transistor 142 may accordingly serve as a kicker device that may speed up the settling of the memory cell bias voltage.

Accordingly, during operation, a current may be developed in the leg 111 of the pre-sense circuit 105 that corresponds to the state, e.g. the resistance, of the memory cell 110. The cascode transistor generating the current receives a reference voltage SLVREF and a bias current 130. The current corresponding to the state of the memory cell may be translated into a voltage at the node 113 in part by the transistors 122 and 142. A reference current is provided in the leg 112 for comparison. The leg 112 accordingly includes components selected to match the components in the leg 111. A dummy bit line 134 is provided and coupled to the cascode transistor 121 through other components. The dummy bit line 134 is provided to match a capacitance provided by the memory cell 110. In this manner, the loading of the lines 111 and 112 may be substantially equal. The leg 112 further includes transistors 146 configured to match the decoding transistors 144. The leg further includes an isolation transistor 133 configured to match the isolation transistor 132. A reference current source 148 is provided and coupled to the isolation transistor 133. Accordingly, a current will be provided through the cascode transistor 121 that is based on the current provided by the reference current source 148. The current through the cascode transistor 121 may be translated into a voltage at the node 114 in part by the transistors 123 and 152, which may match the transistors 122 and 142.

Note that the dummy bit line 134 may allow the leg 112 to be loaded in substantially the same manner as the leg 11. Accordingly, during a sensing operation, the voltages at the nodes 113 and 114 may ramp up at substantially a same rate. In this manner, the comparator 107 may utilize the voltages at the nodes 113 and 114 at an earlier time than if the nodes were ramping up at a different rate, and the comparator 107 was required to wait until the voltages had stabilized. That is, by providing a same capacitive loading in the leg 112 as the leg 111, a voltage difference at the nodes 113 and 114 may be reliably sensed earlier. The two matching legs 111 and 112 may also improve power noise immunity and reduce an impact of displacement current mismatch in some examples.

Recall that the pre-sense circuit 105 is provided in a high voltage power domain. That is, a voltage higher than the reference voltage $V_{cc}$ is provided to the legs 111 and 112. In FIG. 1, the higher reference voltage is shown as VHSEN-LDR. The higher reference voltage allows a high bias condition to be provided to the memory cell 110. The comparator 107, however, operates in a different power domain, with reference voltage $V_c$ provided to the comparator 107. In this manner, thin oxide devices may be used to implement the comparator 107 as they may not be required to couple to the higher reference voltage. The lower power supply used by the comparator 107 may also lower the power consumption of the comparator 107.

Capacitors 155 and 157 are provided between the outputs of the pre-sense circuit 105 and the inputs of the comparator 107. The capacitors 155 and 157 provide isolation from the higher reference voltage VHSENLDR. The capacitors 155 and 157 may be implemented, for example, using thick oxide transistors.

The comparator 107 includes transistors 162 and 164. The transistors 162 and 164 may be implemented as p-FET transistors having one source/drain coupled to nodes 113 or 114, respectively through the capacitors 155, 157. The other source/drain of the transistors 162, 164 are coupled to cross-coupled inverters 166, 168, respectively. The cross-coupled inventers 166 and 168 are configured to latch a voltage difference sensed at the nodes 155 and 157 to provide an output signal SDOUT. The transistors 162, 164 may be turned on by a control signal SDSINLATB to begin a sensing operation.

The sensing circuit 100 of FIG. 1 operates in two modes to sense data stored in the memory cell 110. A first mode is equalization mode. During equalization mode, the transistors 142 and 152 may be turned on to provide a fast path to settle a bias voltage of the cell 110. A switch 170 may also be closed. The switch 170 is coupled between the emitters of the cascode transistors 120 and 121. By connecting the emitters of the cascode transistors 120 and 121 together, the current in both legs 111 and 112 may be equal. In the comparator 107, the switches 172 and 174 may be closed during equalization mode. The switches 172 and 174 are each coupled between a respective input of the comparator 107 and $V_{CC}$. When the switches 172 and 174 are closed, both inputs are accordingly equalized to $V_{cc}$. Transistors 162 and 164 may also be turned on during equalization so the equalized voltage may be provided to the cross-coupled inverters 164 and 168.

A second mode is amplification mode. Amplification mode may begin once a bias voltage to the memory cell 110 has settled. During amplification mode, the switches 170, 172, and 174 may be opened. The transistors 142 and 152 may also be turned off. A voltage difference may begin to develop between the nodes 113 and 114 using the transistors 122 and 123, as described above. Towards the end of amplification mode, the transistors 162 and 164 may be turned off to hold a voltage difference sampled and latched by the cross-coupled inverters 164 and 168. The transistors 162 and 164 may be turned off in accordance with a control signal, e.g. SDSINLATB. Switches 176 and 178 may also be provided between the respective inverters 168 and 164 and the power supply. The switches 176 and 178 may be closed responsive to a delayed version of the SDSINLATB signal. In this manner, the switches 176 and 178 may close at a time after the transistors 162 and 164 are turned off so that the cross-coupled inverters 164 and 168 may latch the sensed voltage at a time after it is sampled by the transistors 162 and 164. The delay may be on the order of 1 nanosecond in some examples.

In this manner, the sensing circuit 100 may be used to sense a state of one or more memory cells, which may be PCM memory cells.

Embodiments of the invention further include reference voltage generators that may be used, for example, to provide the SLVREF signal applied to the gates of cascode transistors 120 and 121 of FIG. 1. Sensing circuits, such as the sensing circuit 100 of FIG. 1, may be distributed throughout an array of memory cells, such as an array of PCM memory cells. Distributing sensing circuits throughout a memory cell array may allow for faster reading operations. However, it may require the reference voltage signal to also be routed throughout the array of memory cells. A long routing of the reference voltage signal may have disadvantageous consequences in that it may load the sensing circuit, such as the sensing circuit 100 of FIG. 1. The long routing may be viewed as presenting an effective output resistance ($R_{out}$) to the reference voltage. The effective transconductance of the cascode transistor 120 of FIG. 1 may be affected by the output resistance. The effective transconductance of the cascode transistor may be expressed as:

$$G_m = \frac{g_m}{\left(1 + \frac{g_m R_{out}}{\beta}\right)}$$

Where $g_m$ is the transconductance of the transistor and $\beta$ is the current gain of the transistor. Generally, a higher Gm may be desired, and therefore a low Rout. Accordingly, embodiments of the present invention may provide output drivers for a global reference generator. That is, a reference voltage generator may be provided for a number of memory banks. Output drivers may be distributed among the memory banks to reduce the impact of the resistive routing.

Figure 2:
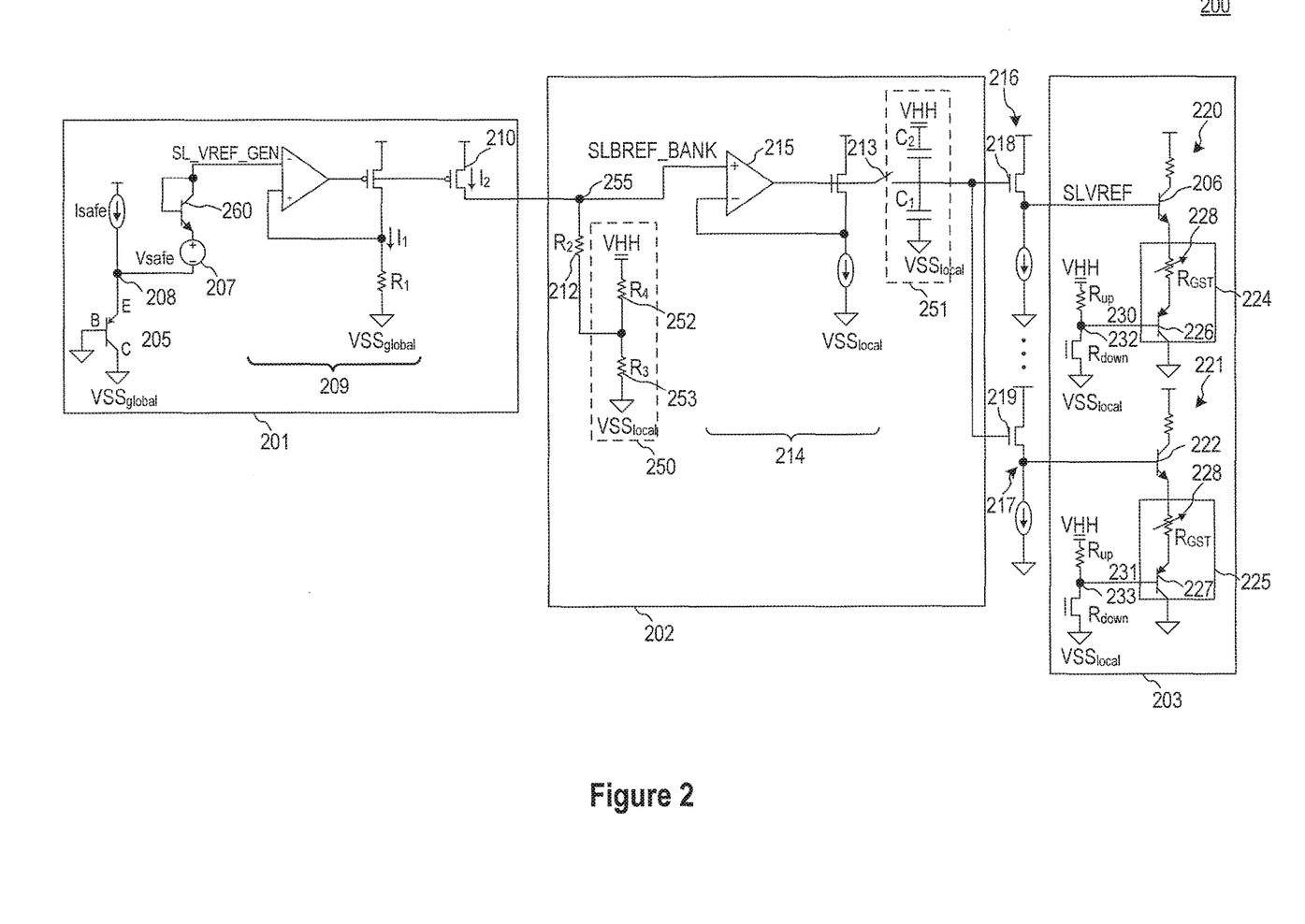
FIG. 2 is a schematic illustration of a reference voltage generator scheme in accordance with an embodiment of the present invention.

FIG. 2 is a schematic illustration of a reference voltage generator scheme in accordance with an embodiment of the present invention. The reference voltage generator scheme 200 may include a global reference voltage generator 201, a bank reference voltage generator 202, and sensing circuits 203.

The global reference voltage generator 201 may include a bipolar transistor 205 that may match a bipolar transistor used in the memory cell, such as the bipolar transistor 226 shown in FIG. 2. A voltage $V_{safe}$ provided by voltage source 207 may be added to an emitter-base voltage of the transistor 205 at the node 208 to provide a voltage SL_VREF_GEN through a transistor 260. The transistor 260 may be a bipolar transistor and may match another bipolar transistor used in the sensing circuits, such as the bipolar transistor 206 shown in FIG. 2. The SL_VREF_GEN voltage may then be converted to a current $I_1$ through the voltage to current converter 209. By converting the global reference voltage to a current $I_1$, differences in ground or other power supply voltages which may occur across a die may have less of an effect on the distribution of a reference voltage. The reference current $I_1$ may be expressed as:

$$I_1 = \frac{(V_{SL\_VREF\_GEN} - VSS_{global})}{R_1}$$

An output transistor 210 may then provide an output current $I_2$, which may be a mirrored $I_1$, e.g. may have the same value as $I_1$. The global reference voltage generator 201 may be provided for many banks of memory cells. The current $I_2$ may be provided to multiple bank reference voltage generators, including the bank reference voltage generator 202.

The bank reference voltage generator 202 may be provided for a bank of memory cells. In some examples, the bank reference generator 202 may also serve multiple banks, but generally fewer banks than are served by the global reference voltage generator 201. Only one bank reference voltage generator 202 is shown in FIG. 2, however many may be connected to the global reference voltage generator 201, as will be described further below.

The bank reference voltage generator 202 may include a resistive element 212 that may be coupled to the output transistor 210 and may provide a reference voltage SLVREF_BANK from the current $I_2$. The resistive element 212 is shown as a resistor in FIG. 2, however any resistive element may be used. The bank reference voltage, e.g. SLVREF_BANK is accordingly provided based on $I_2$ and $R_2$ and the local VSS voltage and may be given as:

$V_{SLVREF\_bank} - VSS_{local} = I_2 * R_2$. Recall $I_1$ may equal $I_2$ and $R_1$ may equal $R_2$. Accordingly, $V_{SL\_VREF\_GEN} - VSS_{global} = V_{SLREF\_BANK} - VSS_{local}$. In this manner, the voltage difference between the VSS supply and the reference voltage is preserved between the global reference voltage generator 201 and the bank reference voltage generator 202. The scheme 200 may accordingly advantageously compensate for variations in the $V_{SS}$ or other supply voltage across the memory device.

A replica circuit 214 may be coupled to the resistive element 212 and may receive the SLVREF_BANK signal at an input of a comparator 215. The replica circuit 214 is configured to provide a bias voltage for one or more source follower circuits, including the source-follower circuits 216, 217 shown in FIG. 2. Any number of source-follower circuits may be coupled to the bank reference voltage generator 202, as will be described further below. A switch 213 may be coupled between an output of the replica circuit 214 and inputs of the source follower circuits 216, 217 so that the replica circuit may operate in a sample-and-hold mode. Each of the source follower circuits 216, 217 includes a respective transistor 218, 219. Each of the transistors 218, 219 is coupled to an output of the replica circuit 214 at a gate of the transistor 218, 219. Each of the transistors 218, 219 has a source coupled to a sensing circuit of the sensing circuits 201. In this manner, the source follower configurations 216, 217 may provide a small output resistance to the sensing circuits 203. The source follower circuits 216, 217 may be biased in a sub-threshold region of the transistors 218, 219 to further reduce output resistance in some examples. The source follower circuits 216, 217 may also be referred to as drivers herein, as will be described further below.

The sensing circuits 203 of FIG. 2 include sensing circuits 220, 221, although any number of sensing circuits may be present. The sensing circuit 100 of FIG. 1 may be used to implement one or more of the sensing circuits 220, 221 in some examples. Referring back to FIG. 2, each of the sensing circuits 220, 221 include a respective bipolar junction transistor 206, 222. Each of the sensing circuits 220, 221 is configured to sense a state of a respective memory cell 224, 225, which may be PCM memory cells. Each PCM memory cell 224, 225 is represented in FIG. 2 as a bipolar junction transistor 226, 227 and variable resistor 228, 229. Each of the memory cells 224, 225 are coupled to a respective wordline 230, 231.

Wordline drivers 232, 233 are provided to drive the wordlines 230, 231. The wordline drivers may utilize a power supply voltage $V_{HH}$, which may be provided, for example, by a voltage regulator (not shown in FIG. 2). The wordline drivers include respective resistors and transistors, illustrated in FIG. 2 as $R_{up}$ and $R_{down}$, where $R_{down}$ represents the resistance of the transistors used in the wordline drivers. The wordline drivers 232, 233 provide a wordline voltage on the wordlines 230, 231 which may be given as:

$$V_{WL} = \frac{R_{down}}{R_{up} + R_{down}} * VHH$$

However, the supply voltage $V_{HH}$ may vary at different sensing circuits in accordance with different loading conditions. Accordingly, the reference voltage SLVREF may need to be compensated in anticipation of differences in the wordline voltage. Embodiments of the present invention may also include wordline compensation. FIG. 2 illustrates two wordline compensator circuits 250, 251. The wordline compensator circuit 250 may be implemented as a resistor divider including resistors 252, 253. Although resistors are shown, any resistive elements may be used. The resistors 252, 253 are selected such that the ratio of their resistance is equal to the ratio of resistances in the wordline drivers 232, 233. That may be expressed as:

$$\frac{R_4}{R_3} = \frac{R_{up}}{R_{down}}$$

Note also that the resistance $R_2+R_3$ may be equal to $R_1$. In this manner, the wordline compensation circuit 250 may compensate the reference voltage SLVREF_BANK during a sample mode of the sample-and-hold operation by adjusting the voltage at the node 255.

A second wordline compensation circuit 251 may be provided for compensation during the hold mode of the sample-and-hold operation. The second wordline compensation circuit 251 is coupled to an output of the replica circuit 214 after the switch 213. The second wordline compensation circuit is implemented as a capacitance voltage divider including capacitors C1 and C2. Although capacitors are shown, any capacitive elements may be used. The capacitances C1 and C2 may be selected such that:

$$\frac{C_2}{C_1} = \frac{R_{up}}{R_{down}}$$

In this manner, the voltage at an input to the source follower circuits 216, 217, may be compensated for by the wordline compensation circuit 251.

Accordingly, embodiments of voltage generators have been described which may provide a reference voltage to banks of memory by locally buffering the reference voltage to reduce the output resistance of the reference voltage generator. Moreover, embodiments of reference voltage generators have been described that may utilize voltage to current conversion in part to compensate for variations in power supply voltage. Still further, embodiments of reference voltage generators have been described that may compensate for variations in wordline voltage across memory cells, memory banks, or both.

Figure 3:
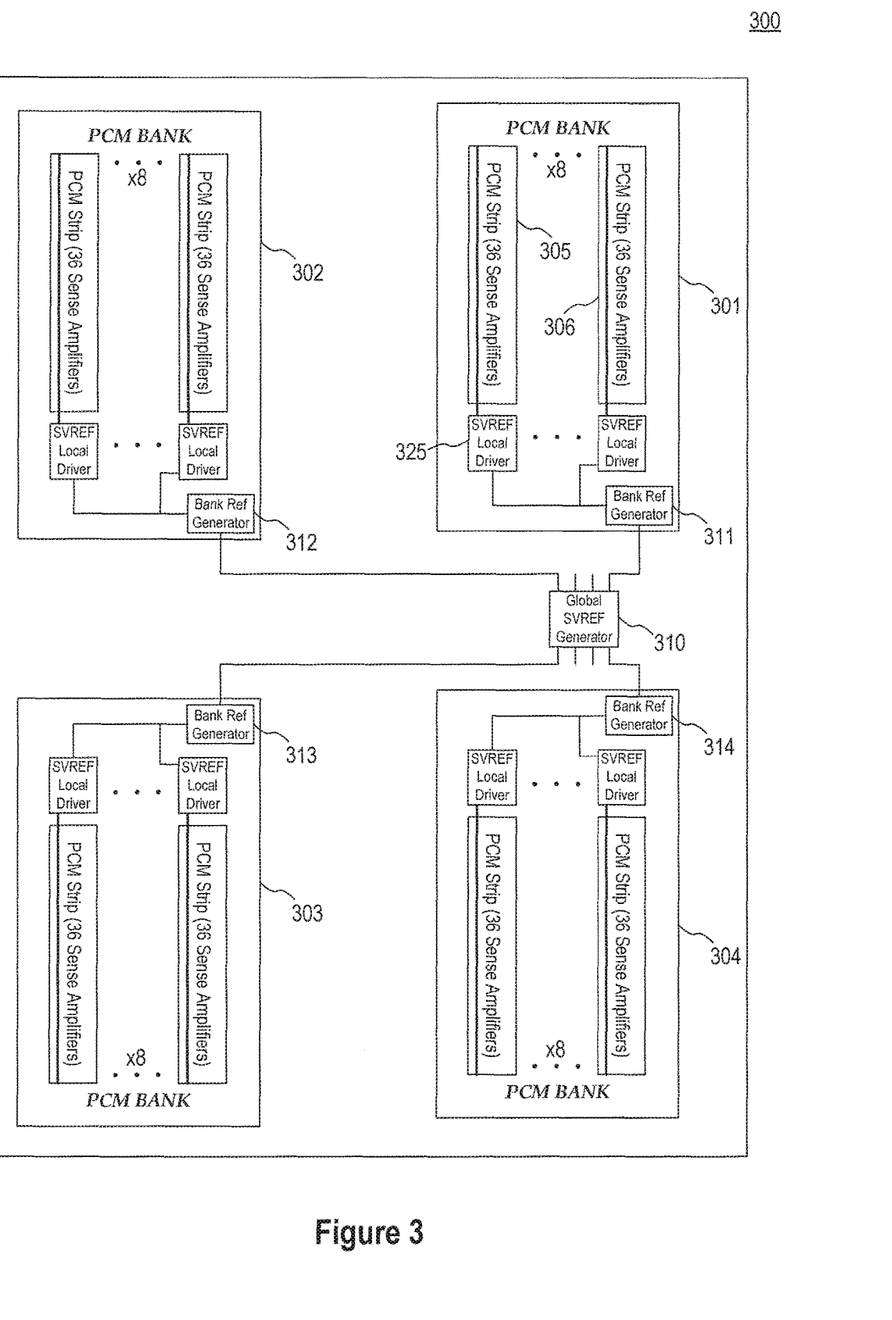
FIG. 3 is a schematic illustration of reference voltage routing in accordance with an embodiment of the present invention.

FIG. 3 is a schematic illustration of reference voltage routing in accordance with an embodiment of the present invention. A memory device 300 may include any number of memory banks. The memory device 300 is shown as including banks 301-304. Each bank may include a number of memory cells and sense amplifiers. As shown in FIG. 3, the memory bank 301 may include eight strips of memory cells including strips 305, 306, each of which may have 36 sense amplifiers.

A global reference voltage generator 310 may be provided on the memory device 300. The global reference voltage generator 310 may be implemented, for example, by the global reference voltage generator 201 of FIG. 2. Each bank of memory cells 301-304 may include a bank reference voltage generator 311-314. One of the bank reference voltage generators 311-314 may be implemented, for example, using the bank reference voltage generator 202 of FIG. 2. Each strip of memory cells may be provided with a local driver. For example, the strips 305 and 306 are coupled to the local drivers 325, 326. The local drivers 325, 326 are coupled to the bank reference generator 311. The local drivers 325, 326 may be implemented, for example, by the source follower circuits 216, 217 of FIG. 2.

In this manner, a global reference generator 310 may provide a reference voltage for use in sensing a state of memory cells in the memory device. The reference voltage may be distributed to bank reference voltage generators 311-314 which may be distributed across the memory device. The bank reference voltage provided at each of the memory banks may then be driven by local drivers to each strip of memory cells. In this manner, as has been described above, the impact of output resistance and the deleterious affects of supply voltage variations across a memory device may be addressed.

Figure 4:
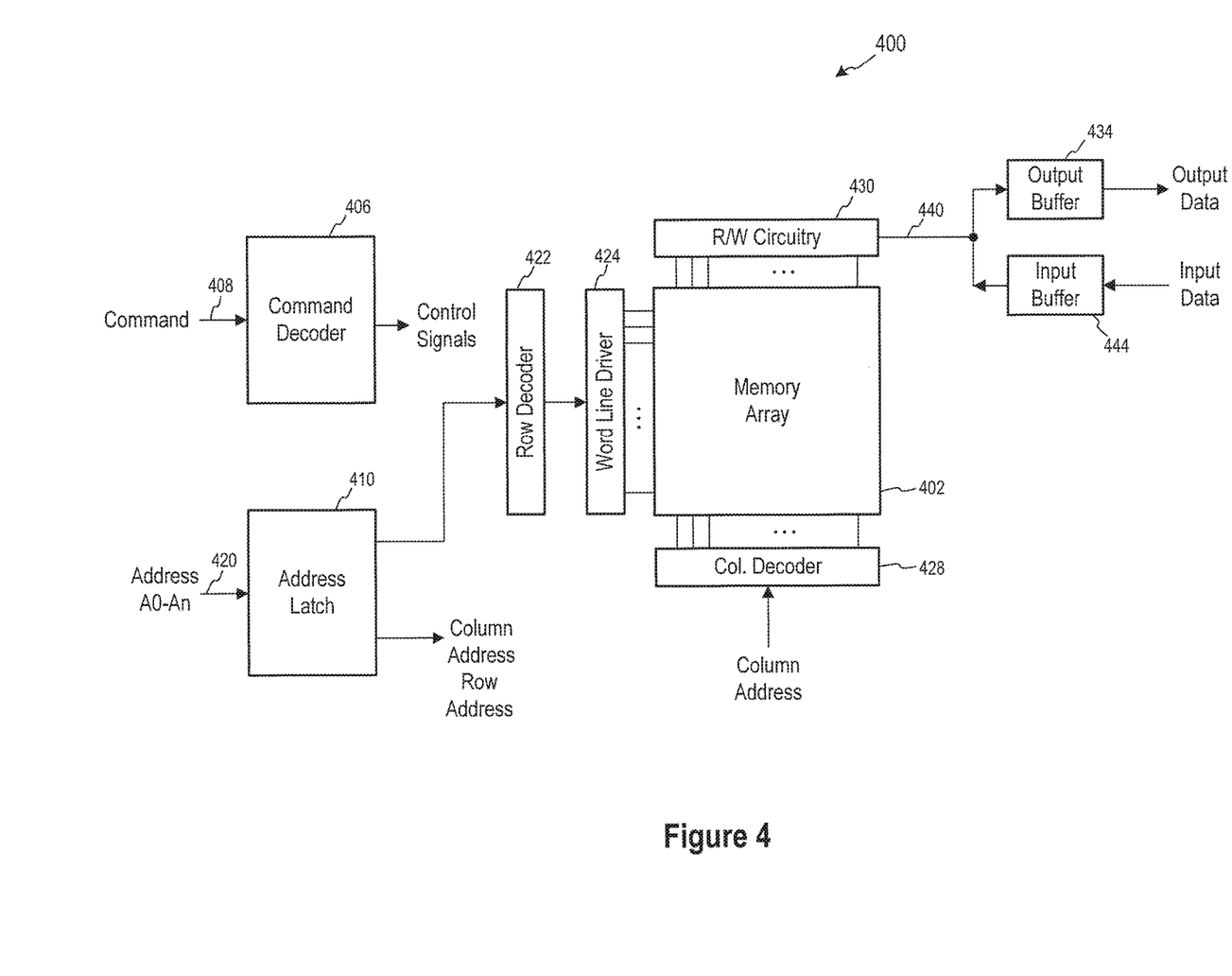
FIG. 4 is a schematic illustration of a portion of a memory device according to an embodiment of the present invention.

FIG. 4 is a schematic illustration of a portion of a memory device according to an embodiment of the present invention. The memory 400 includes an array 542 of memory cells, which may be, for example, phase change memory cells, DRAM memory cells, SRAM memory cells, flash memory cells, or some other type of memory cells. The memory system 400 includes a command decoder 406 that may receive memory commands through a command bus 408 and provide corresponding control signals within the memory system 400 to carry out various memory operations. The command decoder 406 may respond to memory commands applied to the command bus 408 to perform various operations on the memory array 402. For example, the command decoder 406 may be used to provide internal control signals to read data from and write data to the memory array 402. Row and column address signals may be applied to the memory system 400 through an address bus 420 and provided to an address latch 410. The address latch may then output a separate column address and a separate row address.

The row and column addresses may be provided by the address latch 410 to a row address decoder 422 and a column address decoder 428, respectively. The column address decoder 428 may select bit lines extending through the array 402 corresponding to respective column addresses. The row address decoder 422 may be connected to word line driver 424 that may activate respective rows of memory cells in the array 402 corresponding to received row addresses. The selected data line (e.g., a bit line or bit lines) corresponding to a received column address may be coupled to read/write circuitry 430 to provide read data to a data output buffer 434 via an input-output data bus 440. Write data may be applied to the memory array 402 through a data input buffer 444 and the memory array read/write circuitry 430. Examples of the sense amplifiers and reference voltage distribution circuitry described above may be utilized as a portion of the read/write circuitry 430, row decoder 422, column decoder 428, word line driver 424, or combinations thereof.

The memory device shown in FIG. 4 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of sensing circuitry and/or reference voltage generators described above to perform their ultimate user function.

From the foregoing it will be appreciated that, although specific embodiments of the invention have been described herein for purposes of illustration, various modifications may be made without deviating from the spirit and scope of the invention.

What is claimed is:

1. A memory device comprising:
a global reference voltage generator configured to provide a global reference voltage;
a plurality of bank reference generators, individual ones of the plurality of bank reference generators positioned proximate a respective bank of memory cells, wherein the plurality of bank reference generators are coupled to the global reference voltage generator and configured to provide respective bank reference voltages;
a respective wordline compensation circuit coupled to a corresponding bank reference generator of the plurality of bank reference generators, the respective wordline compensation circuit configured to compensate a respective supply voltage variation of the corresponding bank reference generator; and
a respective plurality of driver circuits coupled to each of the bank reference generators, individual ones of the plurality of driver circuits configured to provide the bank reference voltage to a strip of memory cells.

2. The memory device of claim 1, wherein individual ones of the plurality of driver circuits comprise source follower circuits.

3. The memory device of claim 1, wherein the memory cells are phase change memory cells.

4. The memory device of claim 1, wherein individual ones of the plurality of driver circuits are configured to provide the bank reference voltage to sensing circuits in the strip of memory cells.

5. The memory device of claim 1, wherein the plurality of bank reference generators are distributed throughout the memory device.

6. An apparatus comprising:
a global reference voltage generator configured to provide a global reference voltage;
a memory bank coupled to the global reference voltage generator and comprising a bank reference generator and a driver circuit, the bank reference generator configured to provide a bank reference voltage based on the global reference voltage, the driver circuit configured to provide the bank reference voltage to a memory cell; and
a wordline compensation circuit configured to compensate a supply voltage variation of the bank reference generator during a sample and hold operation.

7. The apparatus of claim 6, wherein the global reference voltage generator comprises a voltage to current generator and a output transistor that is configured to convert a first reference voltage to a first current, wherein the output transistor is configured to mirror the first current to provide a second current, where global reference voltage is generated based on the second current.

8. The apparatus of claim 7, wherein the voltage to current generator comprises an amplifier coupled to a transistor, wherein a voltage based on a current through the transistor is provided as feedback to an input of the amplifier.

9. The apparatus of claim 8, wherein the bank reference generator comprises a switch configured to selectively couple an output of the bank reference generator to the memory bank.

10. An apparatus comprising:
a global reference voltage generator configured to provide a global reference voltage; and
a memory bank coupled to the global reference voltage generator and comprising a bank reference generator and a driver circuit, the bank reference generator configured to provide a bank reference voltage based on the global reference voltage the driver circuit configured to provide the bank reference voltage to a memory cell, wherein the bank reference generator further comprises a wordline compensation circuit coupled between an output of the voltage to current generator and the memory bank and configured to compensate the bank reference voltage during a hold mode of a sample and hold operation.

11. An apparatus comprising:
a global reference voltage generator configured to provide a global reference voltage; and
a memory bank coupled to the global reference voltage generator and comprising a bank reference generator and a driver circuit, the bank reference generator configured to provide a bank reference voltage based on the global reference voltage the driver circuit configured to provide the bank reference voltage to a memory cell, wherein the bank reference generator further comprises a wordline compensation circuit coupled between an output of the global reference voltage generator and an input of an amplifier of the bank reference generator and the memory bank and configured to compensate the global reference voltage during a sample mode of the sample and hold operation.

12. The apparatus of claim 11, wherein the wordline compensation circuit comprises a first resistance coupled between a node and a first voltage, a second resistance coupled between the node and a second voltage, and a third resistance coupled between a wordline and the node.

13. The apparatus of claim 10, wherein the wordline compensation circuit comprises a first capacitance coupled between a node and a first voltage and a second capacitance coupled between the node and a second voltage.

14. The apparatus of claim 10, wherein memory bank further comprises a sensing circuit coupled to a memory cell, the sensing circuit configured to access the memory cell based on the bank reference voltage.

15. A method comprising:
providing a global reference voltage to a plurality of bank reference generators, wherein individual ones of the plurality of bank reference generators are positioned proximate a respective bank of memory cells;
providing respective bank reference voltages from each of the plurality of bank reference generators to a strip of memory cells of the respective bank of memory cells based on the reference voltage; and
compensating a respective supply voltage variation of each of the plurality of bank reference generators, the supply voltage variation associated with the strip of memory cells of the respective bank of memory cells.

16. The method of claim 15, wherein providing the global reference voltage to the plurality of bank reference generators comprises mirroring a current through a transistor based on the global reference voltage.

17. The method of claim 15, wherein providing the respective bank reference voltages from each of the plurality of bank reference generators to the strip of memory cells of the respective bank of memory cells based on the global reference voltage comprises mirroring a current through a transistor based on the respective bank reference voltage.

18. The method of claim 15, further comprising decoupling the respective bank reference voltages from the strip of memory cells of the respective bank of memory cells via a switch.

19. The method of claim 15, further comprising compensating the global reference voltage during a sample mode of a sample and hold operation associated with the strip of memory cells of the respective bank of memory cells.

20. The method of claim 15, further comprising compensating the respective bank reference voltages during a hold mode of a sample and hold operation associated with the strip of memory cells of the respective bank of memory cells.

* * * * *